(12) United States Patent
Kim

(10) Patent No.: US 9,281,189 B2
(45) Date of Patent: Mar. 8, 2016

(54) WAFER AND METHOD OF FABRICATING THE SAME

(71) Applicant: Moo Seong Kim, Seoul (KR)

(72) Inventor: Moo Seong Kim, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 14/354,858

(22) PCT Filed: Oct. 26, 2012

(86) PCT No.: PCT/KR2012/008906
§ 371 (c)(1),
(2) Date: Apr. 28, 2014

(87) PCT Pub. No.: WO2013/062380
PCT Pub. Date: May 2, 2013

(65) Prior Publication Data
US 2014/0284627 A1   Sep. 25, 2014

(30) Foreign Application Priority Data

Oct. 26, 2011   (KR) .................. 10-2011-0109730

(51) Int. Cl.
| | |
|---|---|
| *H01L 21/8238* | (2006.01) |
| *H01L 21/02* | (2006.01) |
| *C30B 25/16* | (2006.01) |
| *C30B 29/06* | (2006.01) |

(Continued)

(52) U.S. Cl.
CPC .......... *H01L 21/02694* (2013.01); *C30B 25/16* (2013.01); *C30B 29/06* (2013.01); *H01L 21/0243* (2013.01); *H01L 21/0262* (2013.01); *H01L 21/02378* (2013.01); *H01L 21/02433* (2013.01); *H01L 21/02499* (2013.01); *H01L 21/02529* (2013.01); *H01L 21/02532* (2013.01); *H01L 29/1608* (2013.01); *H01L 29/34* (2013.01)

(58) Field of Classification Search
CPC ................... H01L 21/67248; H01L 21/67288; H01L 21/02293; H01L 21/02694; H01L 21/20; H01L 21/2033–21/2085; H01L 21/36; H01L 39/2458; H01L 22/10–22/12
See application file for complete search history.

(56) References Cited

U.S. PATENT DOCUMENTS

| | | | |
|---|---|---|---|
| 5,252,173 A | * | 10/1993 | Inoue ........................... 438/509 |
| 6,478,883 B1 | | 11/2002 | Tamatsuka et al. |
| 2004/0053438 A1 | * | 3/2004 | Abe et al. ........................ 438/93 |

(Continued)

FOREIGN PATENT DOCUMENTS

| | | |
|---|---|---|
| KR | 10-2001-0031575 | 4/2001 |
| KR | 10-2006-0077811 A | 7/2006 |

(Continued)

OTHER PUBLICATIONS

International Search Report in International Application No. PCT/KR2012/008906, filed Oct. 26, 2012.

*Primary Examiner* — David Vu
*Assistant Examiner* — Cuong Nguyen
(74) *Attorney, Agent, or Firm* — Saliwanchik, Lloyd & Eisenschenk

(57) ABSTRACT

Disclosed is a method of manufacturing a thin film, the method including: growing an epitaxial layer on a surface of a wafer at a growth temperature, wherein the growing of the epitaxial layer comprises controlling a defect present on a surface of the wafer. Also, disclosed is a wafer including: a substrate; and an epitaxial layer located on the substrate, wherein a basal dislocation density of the epitaxial layer is equal to or less than 1/cm2.

18 Claims, 1 Drawing Sheet

(51) Int. Cl.
*H01L 29/16* (2006.01)
*H01L 29/34* (2006.01)

(56) References Cited

U.S. PATENT DOCUMENTS

2007/0080369 A1* 4/2007 Sakai ........................... 257/103
2009/0114148 A1* 5/2009 Stahlbush et al. ............... 117/89
2010/0078767 A1 4/2010 Park
2011/0006309 A1 1/2011 Momose et al.

FOREIGN PATENT DOCUMENTS

| KR | 10-2010-7006931 | * | 3/2009 | .............. C30B 25/20 |
| KR | 10-2010-0036155 A | | 4/2010 | |
| KR | 10-2010-0050562 A | | 5/2010 | |

* cited by examiner

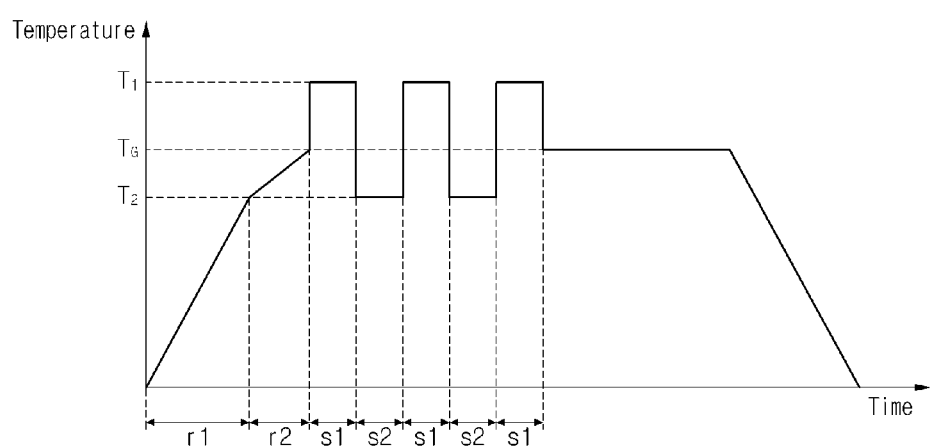

WAFER AND METHOD OF FABRICATING THE SAME

CROSS-REFERENCE TO RELATED APPLICATIONS

This application is the U.S. national stage application of International Patent Application No. PCT/KR2012/008906, filed Oct. 26, 2012, which claims priority to Korean Application No. 10-2011-0109730, filed Oct. 26, 2011, the disclosures of each of which are incorporated herein by reference in their entirety.

TECHNICAL FIELD

The disclosure relates a wafer and a method of fabricating the same.

BACKGROUND ART

The most important subject in studies for improving the efficiency and characteristic of semiconductor devices is to reduce the crystal defect of a semiconductor layer grown on a substrate and to improve crystallinity of the semiconductor layer.

Various types of defects may be formed when fabricating an epitaxial wafer (hereinafter, these defects will be referred to as epitaxial defects). For instance, there may be presented various defects, such as a defect created in a basal plane of a lattice, a defect caused by the tilting of the lattice, and a defect created on a surface of the wafer. These defects may exert bad influence upon the semiconductor device employing the wafer. In addition, when the semiconductor device is fabricated by using the wafer, great leakage current may be generated due to the non-uniformity of metal electrode deposition and patterns.

A buffer layer is formed in order to reduce the dislocation defect during the crystal growth process. Thus, a mask forming process, a process for forming a pattern on a substrate through etching, and a regrowth process are additionally necessary to form the buffer layer.

Due to the above additional processes, the fabrication process is complicated, the fabrication cost is increased, and the quality of a substrate surface is deteriorated.

DISCLOSURE OF INVENTION

Technical Problem

The embodiment provides a thin film of high quality.

Solution to Problem

According to the embodiment, there is provided a method of manufacturing a thin film, the method including: growing an epitaxial layer on a surface of a wafer at a growth temperature, wherein the growing of the epitaxial layer comprises controlling a defect present on a surface of the wafer.

According to another embodiment, there is provided a wafer including: a substrate; and an epitaxial layer on the substrate, wherein a basal dislocation density of the epitaxial layer is equal to or less than 1/cm2.

Advantageous Effects of Invention

The thin film manufacturing method according to the embodiment includes a step of controlling a defect. In the step of controlling a defect, a defect present on a surface of the wafer can be controlled. In detail, by regulating a process temperature, a change in growth rate in the same growth condition can be finely regulated, and a path of a defect on a surface of the wafer can be changed. That is, since defects may be suppressed through a simple method of regulating a process temperature, process time and process costs can be reduced.

Further, stress in the epitaxial layer can be attenuated and a defect present on a surface of the wafer can be prevented from being transited to the epitaxial layer through the step of controlling the defect. Thus, a performance of the epitaxial layer can be enhanced by reducing a defect of the epitaxial layer and a surface roughness can be enhanced. Further, a process yield rate of a device using the wafer can be enhanced.

BRIEF DESCRIPTION OF DRAWINGS

FIG. 1 is a graph for explaining a method of manufacturing a thin film according to an embodiment of the present invention.

MODE FOR THE INVENTION

In the description of the embodiments, it will be understood that, when a layer (film), a region, a pattern or a structure is referred to as being "on" or "under" another layer (film), another region, another pattern or another structure, it can be "directly" or "indirectly" on the other layer (film), region, pattern, or structure, or one or more intervening layers may also be present. Such a position of the layer has been described with reference to the drawings.

The thickness and size of each layer (film), each region, each pattern or each structure shown in the drawings may be modified for the purpose of convenience or clarity, so the size of elements does not utterly reflect an actual size.

Hereinafter, exemplary embodiments will be described in detail with reference to the accompanying drawing.

Referring to FIG. 1, a method of manufacturing a thin film according to an exemplary embodiment of the present invention. FIG. 1 is a graph for explaining the method of manufacturing a thin film according to the embodiment of the present invention.

The method of manufacturing a thin film according to the embodiment includes a step of growing an epitaxial layer. In the step of growing an epitaxial layer, an epitaxial layer may be grown on a surface of a wafer. The epitaxial layer is formed by growing a monocrystalline layer of a material the same as or different from a wafer material on a surface of a monocrystalline wafer.

In general, the epitaxial layer may be formed through a chemical vapor deposition (CVD) process. In particular, the chemical vapor deposition process may include thermal chemical vapor deposition, plasma enhanced chemical vapor deposition, low pressure chemical vapor deposition, metal organic chemical vapor deposition, and atomic layer deposition, and the processes may be properly selected according to the characteristics of the film.

In the chemical vapor deposition process, reaction gases such as a source gas, a carrier gas, and a temperature regulating gas may be supplied onto a wafer located in a vacuum chamber, and an epitaxial layer may be formed on the wafer by using a surface reaction between the reaction gases and the wafer. For example, an epitaxial layer may be formed by depositing a silane ($SiH_4$) or dichlosilane ($SiH_2$) gas and a dopant gas on a surface of a wafer while taking hydrogen (H2) and argon (Ar) gases as carriers in the chemical vapor deposition equipment.

Referring to FIG. 1, the step of growing an epitaxial layer may be performed at a growth temperature. For example, when the wafer is a SiC wafer and a SiC epitaxial layer is grown on the SiC wafer, the growth temperature may be 1450 to 1650° C.

In the process of increasing a temperature of the wafer to the growth temperature, a first ramp-up r1 and a second ramp-up r2 may occur. That is, by performing the temperature increasing process in two steps, a defect can be prevented from being generated in the wafer due to a rapid temperature change.

The step of growing the epitaxial layer includes a step of controlling a defect. That is, after the second ramp-up r2, the step of controlling a defect may be performed. That is, the step of controlling a defect is performed at an initial stage of the step of growing an epitaxial layer.

In the step of controlling a defect, a buffer layer for controlling a defect may be grown.

The step of controlling a defect includes a step s1 of maintaining the wafer at a first temperature T1 and a step s2 of maintaining the wafer at a second temperature T2.

In the step s1 of maintaining the wafer at the first temperature T1, the wafer may be maintained at the first temperature T1 higher than the growth temperature TG. The first temperature T1 may be a temperature higher than the growth temperature TG by 5 to 50° C. When the first temperature T1 higher than the growth temperature TG by less than 5° C., an effect of buffering stress in the grown epitaxial layer and an effect of improving a surface may deteriorate. When the first temperature T1 is a high temperature exceeding the growth temperature TG by 50° C., it may be difficult to control the buffer layer. Preferably, the first temperature T1 may be a temperature higher than the growth temperature TG by 10 to 30° C.

In the step s2 of maintaining the wafer at the second temperature T1, the wafer may be maintained at the second temperature T2 lower than the growth temperature TG. The second temperature T2 may be a temperature lower than the growth temperature TG by 5 to 50° C. When the second temperature T2 is lower than the growth temperature TG by less than 5° C., an effect of buffering stress in the grown epitaxial layer may deteriorate. When the second temperature T2 is a temperature lower than the growth temperature TG by more than 50° C., it may be difficult to control the buffer layer.

The thickness of the buffer layer may be 1 to 10 μm. When the thickness of the buffer layer is less than 1 μm, an effect of buffering stress in the epitaxial layer may be small. When the thickness of the buffer layer exceeds 10 μm, manufacturing costs may increase and it may be necessary to buffer stress by using an additional process. Preferably, the thickness of the buffer layer may be 5 μm.

In the step of controlling a defect, the step s1 of maintaining the wafer at the first temperature T1 and the step of maintaining the wafer at the second temperature T2 may be alternately performed.

The step s1 of maintaining the wafer at the first temperature T1 and the step s2 of maintaining the wafer at the second temperature T2 may be performed at least one time. For example, as shown in FIG. 1, the step s1 of maintaining the wafer at the first temperature T1 may be performed three times and the step s2 of maintaining the wafer at the second temperature T2 may be performed twice. That is, in the step of controlling a defect, The step s1 of maintaining the wafer at the first temperature T1, the step s2 of maintaining the wafer at the second temperature T2, the step s1 of maintaining the wafer at the first temperature T1, the step s2 of maintaining the wafer at the second temperature T2, and the step s1 of maintaining the wafer at the first temperature T1 may be performed in sequence.

Here, the step s1 of maintaining the wafer at the first temperature T1 may be performed for less than 5 minutes. When the step s1 of maintaining the wafer at the first temperature T1 is performed for more than 5 minutes, a surface of the epitaxial layer may be rough.

The step of controlling a defect may be performed at a hydrogen atmosphere. In addition, a process gas may be further introduced. The process gas may be a Si-based, C-based, Cl-based, or Si—C-based precursor.

In the step of controlling a defect, a defect present on a surface of the wafer can be controlled. In detail, by regulating a process temperature, a change in growth rate in the same growth condition can be finely regulated, and a path of a defect on a surface of the wafer can be changed.

Further, stress in the epitaxial layer can be buffered and a defect present on a surface of the wafer can be prevented from being transited to the epitaxial layer through the step of controlling the defect. Through this, a performance of the epitaxial layer can be enhanced by reducing a defect of the epitaxial layer and a surface roughness can be enhanced. Further, a process yield rate of a device using the wafer can be enhanced.

In general, many defects caused by a wafer occur in the epitaxial layer. The defects lower a yield rate of a semiconductor, and always needs to be managed.

Various types of defects may be formed when fabricating an epitaxial wafer (hereinafter, these defects will be referred to as epitaxial defects). For instance, there may be presented various defects, such as a defect created in a basal plane of a lattice, a defect caused by the tilting of the lattice, and a defect created on a surface of the wafer. These defects may exert bad influence upon the semiconductor device employing the wafer. In addition, when the semiconductor device is fabricated by using the wafer, great leakage current may be generated due to the non-uniformity of metal electrode deposition and patterns.

The representative epitaxial defects to be seriously managed are stacking fault and dislocation. These epitaxial defects are derived from a defect in the sub-wafer or particles and formed during the epitaxial layer growth process. In addition, since these epitaxial defects are formed on the surface of the epitaxial layer with a large size, these epitaxial defects may be readily observed by a particle counter or a naked eye.

In particular, the wafer including silicon carbide may have the basal plane dislocation (BPD). The BPD may be caused due to the temperature gradient existing in the wafer or the mismatch caused by thermal expansion. In addition, the BPD may be generated due to the plastic deformation or thermal stress. Since the BPD exerts great influence upon the reliability of the semiconductor device, it is very important to reduce the BPD.

The BPD is frequently observed from a 4° off-axis 4H—SiC wafer or a 8° off-axis 4H—SiC wafer. Among the commercial wafers used in these days, a 4H—SiC wafer is cut in the specific direction at an angle of 4° or 8°. In addition, the 4° off-axis 4H—SiC wafer and the 8° off-axis 4H—SiC wafer refer to the wafers which are cut at an angle of 4° and 8°, respectively.

In the embodiment, the defects can be suppressed by regulating a process temperature at an initial growth stage of the epitaxial layer. That is, since defects may be suppressed through a simple method of regulating a process temperature, process time and process costs can be reduced.

The wafer manufactured through the thin film manufacturing method according to the embodiment includes a substrate and an epitaxial layer, and a basal dislocation density of the epitaxial layer may be equal to or less than 1/cm2. Further, a surface dislocation density of the epitaxial layer may be equal to or less than 1/cm2. That is, a wafer having an improved surface roughness can be manufactured by reducing dislocation density.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effects such feature, structure, or characteristic in connection with other ones of the embodiments.

Although embodiments have been described with reference to a number of illustrative embodiments thereof, it should be understood that numerous other modifications and embodiments may be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:

1. A method of manufacturing a thin film, the method comprising:
   growing an epitaxial layer on a surface of a wafer at a growth temperature,
   wherein the growing of the epitaxial layer comprises controlling a defect present on the surface of the wafer, and
   the controlling of the detect comprises maintaining the wafer at a first temperature higher than the growth temperature; and
   maintaining the wafer at a second temperature lower than the growth temperature;
   wherein the wafer includes silicon carbide;
   wherein the epitaxial layer includes silicon carbide;
   wherein the growing of the epitaxial layer comprises increasing a temperature of the wafer to the growth temperature before the growing of the epitaxial layer, wherein the increasing of the temperature of the wafer comprises a first ramp-up and a second ramp-up; and
   wherein a temperature of the second ramp-up is higher than a temperature of the first ramp-up.

2. The method of claim 1, wherein the controlling of the defect is performed at an initial stage of the growing of the epitaxial layer.

3. The method of claim 1, wherein, in the controlling of the defect, a buffer layer for controlling the defect is grown.

4. The method of claim 1, wherein, in the controlling of the defect, the maintaining of the wafer at the first temperature and the maintaining of the wafer at the second temperature are alternately performed.

5. The method of claim 1, wherein the maintaining of the wafer at the first temperature and the maintaining of the wafer at the second temperature are performed at least one time.

6. The method of claim 1, wherein the first temperature is higher than the growth temperature by 5° C. to 50° C.

7. The method of claim 1, wherein the second temperature is lower than the growth temperature by 5° C. to 50° C.

8. The method of claim 1, wherein the maintaining of the wafer at the first temperature is performed for less than 5 minutes.

9. The method of claim 1, wherein the controlling of the defect is performed at a hydrogen atmosphere.

10. The method of claim 1, wherein a thickness of a buffer layer is 1 µm to 10 µm.

11. A wafer manufactured according to the method of claim 1.

12. A wafer manufactured according to the method of claim 2.

13. A wafer manufactured according to the method of claim 3.

14. A wafer manufactured according to the method of claim 4.

15. A wafer manufactured according to the method of claim 5.

16. A wafer manufactured according to the method of claim 6.

17. The wafer of claim 11, wherein a basal dislocation density of the epitaxial layer is equal to or less than $1/cm^2$.

18. The wafer of claim 17, wherein a surface dislocation density of the epitaxial layer is equal to or less than $1/cm^2$.

* * * * *